United States Patent
Kinouchi et al.

(10) Patent No.: US 9,064,910 B2
(45) Date of Patent: Jun. 23, 2015

(54) BONDING UNIT CONTROL UNIT AND MULTI-LAYER BONDING METHOD

(75) Inventors: Masato Kinouchi, Tokyo (JP); Takayuki Goto, Tokyo (JP); Takeshi Tsuno, Tokyo (JP); Kensuke Ide, Tokyo (JP); Takenori Suzuki, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 0 days.

(21) Appl. No.: 13/260,041

(22) PCT Filed: Oct. 27, 2010

(86) PCT No.: PCT/JP2010/069039
§ 371 (c)(1),
(2), (4) Date: Oct. 17, 2011

(87) PCT Pub. No.: WO2011/052627
PCT Pub. Date: May 5, 2011

(65) Prior Publication Data
US 2012/0031557 A1    Feb. 9, 2012

(30) Foreign Application Priority Data
Oct. 28, 2009    (JP) ................ 2009-247855

(51) Int. Cl.
*B29C 70/68*    (2006.01)
*H01L 21/67*    (2006.01)
(Continued)

(52) U.S. Cl.
CPC ...... *H01L 21/67092* (2013.01); *B81C 1/00357* (2013.01); *B81C 99/0025* (2013.01)

(58) Field of Classification Search
CPC ........ B32B 41/00; B32B 37/00; B29C 70/68; B65C 9/40; B81C 1/00357

USPC ............ 156/272.2, 379.6, 358, 381, 538
See application file for complete search history.

(56) References Cited

U.S. PATENT DOCUMENTS 5,421,953 A * 6/1995 Nagakubo et al. ............. 216/34
6,390,905 B1 * 5/2002 Korovin et al. ............... 451/286
(Continued)

FOREIGN PATENT DOCUMENTS

EP    2 249 377 A1    11/2010
JP    5-160340 A    6/1993
(Continued)

OTHER PUBLICATIONS

Office Action for corresponding Korean Application No. 2011-7023979 mailed Oct. 29, 2012 with translation.
(Continued)

*Primary Examiner* — Daniel McNally
(74) *Attorney, Agent, or Firm* — Birch, Stewart, Kolasch & Birch, LLP

(57) ABSTRACT

A multi-layer bonding method of the present invention includes: forming a first bonded substrate by bonding a first substrate and an intermediate substrate in a bonding chamber; conveying a second substrate inside said bonding chamber when said first bonded substrate is arranged inside said bonding chamber; and forming a second bonded substrate by bonding said first bonded substrate and said second substrate in said bonding chamber. According to such a multi-layer bonding method, the upper-side substrate can be bonded with an intermediate substrate and then a first bonded substrate is bonded with a lower-side substrate without taking out the first bonded substrate from the bonding chamber. For this reason, a second bonded substrate can be produced at high speed and at a low cost.

7 Claims, 14 Drawing Sheets

(51) Int. Cl.
  *B81C 1/00* (2006.01)
  *B81C 99/00* (2010.01)

(56) References Cited

U.S. PATENT DOCUMENTS

| 2002/0152857 | A1* | 10/2002 | Sato et al. | 83/15 |
| 2010/0206454 | A1 | 8/2010 | Maeda et al. | |
| 2011/0011536 | A1* | 1/2011 | Tsuno et al. | 156/362 |
| 2012/0285624 | A1 | 11/2012 | Tsuno et al. | |

FOREIGN PATENT DOCUMENTS

| JP | 2004-358602 | A | | 12/2004 |
| JP | 2008-288384 | A | | 11/2008 |
| JP | 4209457 | B1 | * | 1/2009 |
| JP | 2009-049081 | A | | 3/2009 |
| JP | 2009-147257 | A | | 7/2009 |
| KR | 10-691759 | B1 | | 3/2007 |
| TW | 200937543 | | | 9/2009 |
| WO | WO 2009/057710 | A1 | | 5/2009 |
| WO | 2009/107250 | A1 | | 9/2009 |

OTHER PUBLICATIONS

Decision to Grant, issued Sep. 10, 2014, for Canadian Application No. 2,758,157.
Decision to Grant a Patent (including English translation thereof), dated May 28, 2014, for corresponding Chinese Application No. 201080018540.2.
Taiwanese Office Action dated Nov. 13, 2013, with an English translation.
European Search Report, dated Apr. 7, 2015, issued in corresponding European Patent Application No. 10826759.2.

* cited by examiner

BONDING UNIT CONTROL UNIT AND MULTI-LAYER BONDING METHOD

TECHNICAL FIELD

The present invention is related to a bonding unit control unit and a multi-layer bonding method, and especially, to a bonding unit control unit and a multi-layer bonding method, which are used when a plurality of substrates are bonded to one substrate.

BACKGROUND TECHNIQUE

A MEMS device is known in which miniature electronic parts and machine parts are integrated. As the MEMS device, a micro-relay, a pressure sensor, an acceleration sensor, and so on are exemplified. A room temperature bonding is known in which wafer surfaces activated in a vacuum atmosphere are contacted and bonded. Such a room temperature bonding is suitable for production of the MEMS device. The MEMS device is demanded to have multi-function so that one device is provided with a mechanism section and a circuit section. In such a room temperature bonding, it is demanded to bond three or more wafers into one substrate. Moreover, it is necessary to improve mass productivity in such a room temperature bonding, and it is demanded to bond three or more wafers at higher speed.

In JP 2008-288384A, a 3-dimensional stacking device with high reliability is disclosed. In the 3-dimensional stacking device, each of devices is formed after the plurality of semiconductor wafers are stacked and unified. In the two semiconductor wafers to be stacked, one of the semiconductor wafers has a convex bonding section and the other of the semiconductor wafers has a concave section. The convex section of the semiconductor wafer is directly bonded with the concave section of the other semiconductor wafer.

A 3-dimensional LSI stacking device is disclosed in JP H05-160340A, in which the positions of an interlayer device could be adjusted precisely and bonded. In the 3-dimensional LSI stacking device, a roughly moving stage of a large-stroke low-solution has 4 or more control axes of X, Y, and Z axes and one of the rotation axes θX, θY, and θZ around the above 3 axes. A finely moving stage of a small-stroke high-resolution had 6 control axes of X, Y, and Z axes and the rotation axes θX, θY, and θZ around the above 3 axes. Two wafers can be aligned in the X and Y directions and positioned in the Z direction by the roughly moving stage and the finely moving stage. A sensor senses a distance between the two wafers in the Z direction which is a vertical direction. A load cell detects a load in the wafer bonding. A position detecting section detects a position deviation in the X and Y directions which indicate a plane direction of each of the wafers. A hardening & bonding section bonds the two wafers with adhesive by hardening the adhesive. A movement mechanism positions both of the position detecting section and the hardening & bonding section. Thus, the two wafers are positioned in the X and Y directions by performing a closed loop control of the roughly moving stage and the finely moving stage by a control unit based on position deviations in the X and Y directions of the two wafers detected by said position detecting section. Also, a parallelism adjustment of the two wafers and the pressing of the two wafers are performed by performing a closed loop control of the roughly moving stage and the finely moving stage by the control unit based on the distance detected by said sensor and the load detected by the load cell.

A method of manufacturing a stacking structure is disclosed in JP 2004-358602A, in which the stacking structure of the height of 100 μm or more is manufacture in a high yield in a short time. In the method of manufacturing the stacking structure, a donor substrate is prepared in which a plurality of section pattern members corresponding to the section pattern of the structure are formed. A target substrate is arranged to oppose to the donor substrate. By repeating a process of positioning and pressing the target substrate and the section pattern and then leaving, the section pattern member is transcribed. In such a manufacturing method of the stacking structure, the preparation of the donor substrate includes a first process of forming an inversion pattern layer obtained by inverting the section pattern of the structure on said donor substrate, a second process of forming the plurality of section pattern members by plating a spatial portion corresponding to the section pattern of the structure of the inversion pattern layer, and a third process of removing said inversion pattern layer.

CITATION LIST

[Patent Literature 1]: JP 2008-288384A
[Patent Literature 2]: JP H05-160340A
[Patent Literature 3]: JP 2004-358602A

SUMMARY OF THE INVENTION

One subject matter of the present invention is to provide a bonding unit control unit and a multi-layer bonding method, in which three or more substrates are bonded into one bonded substrate at high speed.

Another subject matter of the present invention is to provide a bonding unit control unit and a multi-layer bonding method, in which three or more substrates are bonded into one bonded substrate at low cost.

Still another subject matter of the present invention is to provide a bonding unit control unit and a multi-layer bonding method, in which displacement of three or more substrates can be prevented.

A multi-layer bonding method of the present invention includes: forming a first bonded substrate by bonding a first substrate and an intermediate substrate in a bonding chamber; conveying a second substrate inside the bonding chamber when the first bonded substrate is arranged inside the bonding chamber; and forming a second bonded substrate by bonding the first bonded substrate and the second substrate in the bonding chamber. According to such a multi-layer bonding method, after the first substrate is bonded with the intermediate substrate, the bonded substrate can be bonded by the second substrate without being taken out from the bonding chamber. Therefore, the second bonded substrate can be at high speed at a low cost.

The intermediate substrate is conveyed into the bonding chamber in a state that the intermediate substrate is put on an intermediate cartridge. The first substrate and the intermediate substrate are bonded in the state that the intermediate substrate is put on the intermediate cartridge. The intermediate cartridge is conveyed from the bonding chamber in the state that the first bonded substrate is not put on the intermediate cartridge, after the first substrate and the intermediate substrate are bonded. The second substrate is conveyed into the bonding chamber in a state that is put on a cartridge, after the intermediate cartridge is conveyed out from the bonding chamber. Preferably, the first bonded substrate and the second substrate are bonded in the state that the second substrate is put on the cartridge.

A load applied between the second substrate and the first bonded substrate when the second substrate and the first bonded substrate are bonded is preferably larger than a load applied between the first substrate and the intermediate substrate when the first substrate and the intermediate substrate are bonded.

Preferably, the multi-layer bonding method further includes: activating opposing surfaces of the intermediate substrate and the first substrate before the first substrate and the intermediate substrate are bonded; and activating opposing surfaces of the second substrate and the first bonded substrate before the first bonded substrate and the second substrate are bonded.

Preferably, the multi-layer bonding method further includes: aligning the first substrate and the intermediate substrate before the first substrate and the intermediate substrate are bonded; and aligning the first bonded substrate and the second substrate before the first bonded substrate and the second substrate are bonded.

Preferably, the multi-layer bonding method further includes: producing the intermediate substrate by processing a third bonded substrate produced by bonding two substrates.

Preferably, the multi-layer bonding method further includes: producing a plurality of devices by doing the second bonded substrate.

The multi-layer bonding method further includes: decompressing an internal space of the load lock chamber, when the cartridge is arranged in the load lock chamber and the second substrate is put on the cartridge. The second substrate is conveyed from the load lock chamber into the bonding chamber, after the internal space of the load lock chamber is decompressed. The cartridge is provided with island portions contacting the second substrate when the second substrate is put on the cartridge. Passages are provided for the island portions to connect a space between the cartridge and the second substrate to an outside, when the second substrate is put on the cartridge. The gas filling the space is exhausts outside through the passages when the internal space of the load lock chamber is decompressed. Therefore, in such a cartridge, it is possible to prevent the second substrate from moving with respect to the cartridge due to the gas when the atmosphere is decompressed.

A bonding unit control unit of the present invention includes: a driving section configured to control a pressure bonding mechanism to bond a first substrate and an intermediate substrate in a bonding chamber; and a conveying section configured to control a conveyance unit to convey a second substrate into the bonding chamber, when a first bonded substrate formed by bonding the first substrate and the intermediate substrate is arranged in the bonding chamber. The driving section controls the pressure bonding mechanism to bond the first bonded substrate and the second substrate in the bonding chamber. According to such a bonding unit control unit, the first substrate can be bonded with the second substrate without being taken out from the bonding chamber, after the first substrate is bonded with the intermediate substrate. Therefore, the second bonded substrate can be at high speed at a low cost.

The intermediate substrate is conveyed into the bonding chamber in a state that the intermediate substrate is put on an intermediate cartridge. The first substrate and the intermediate substrate are bonded in the state that the intermediate substrate is put on the intermediate cartridge. The intermediate cartridge is conveyed out from inside the bonding chamber in a state that the first bonded substrate is not put on the intermediate cartridge, after the first substrate and the intermediate substrate are bonded. A second substrate is conveyed into the bonding chamber in a state that the second substrate is put on a cartridge, after the intermediate cartridge is conveyed out from the bonding chamber. The first bonded substrate and the second substrate are desirably bonded in a state that the second substrate is put on the cartridge.

Preferably, the driving section drives the pressure bonding mechanism such that a load applied between the second substrate and the first bonded substrate when the second substrate and the first bonded substrate are bonded is larger than a load applied between the first substrate and the intermediate substrate when the first substrate and the intermediate substrate are bonded.

The bonding unit control unit further includes: an activating section configured to control an activating unit such that opposing surfaces of the intermediate substrate and the first substrate are activated before the first substrate and the intermediate substrate are bonded. The driving section controls the activating unit such that opposing surfaces of the second substrate and the first bonded substrate are activated before the first bonded substrate and the second substrate are bonded.

The bonding unit control unit further includes: an aligning section configured to control an alignment mechanism to align the first substrate and the intermediate substrate before the first substrate and the intermediate substrate are bonded. The aligning section controls the alignment mechanism to align the first bonded substrate and the second substrate, before the first bonded substrate and the second substrate are bonded.

The conveying section decompresses an internal space of the load lock chamber, when the cartridge is arranged in the load lock chamber and the second substrate is put on the cartridge. The second substrate is conveyed from the load lock chamber into the bonding chamber, after the internal space of the load lock chamber is decompressed. Island portions are provided for the cartridge to contact the second substrate, when the second substrate is put on the cartridge. Passages are provided for the island portions to connect a space between the cartridge and the second substrate to an outside when the second substrate is put on the cartridge.

In the bonding unit control unit and the multi-layer bonding method by the present invention, three or more substrates can be bonded as one bonded substrate at high speed.

DESCRIPTION OF EMBODIMENTS

Figure 1:
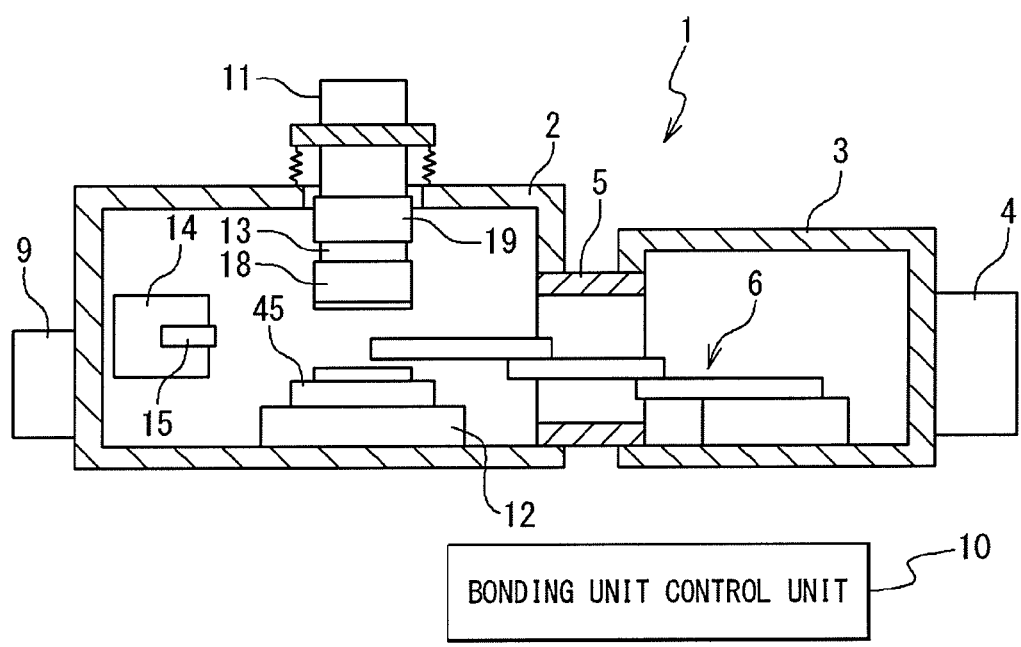
FIG. 1 is a sectional view showing a bonding unit.

Hereinafter, a bonding unit control unit according to the present invention will be described with reference to the attached drawings. As shown in FIG. 1, the bonding unit control unit 10 is used for a bonding system. That is, the bonding system is provided with a bonding unit control unit 10 and a bonding unit 1. The bonding unit 1 is provided with a bonding chamber 2 and a load lock chamber 3. The bonding chamber 2 and the load lock chamber 3 are containers which shield the internal spaces of the chambers from environment. Moreover, the bonding unit 1 is provided with a gate valve 5. The gate valve 5 is interposed between the bonding chamber 2 and the load lock chamber 3. The gate valve 5 is opened or closed to connect the internal space of the bonding chamber 2 and the internal space of the load lock chamber 3, through the control by the bonding unit control unit 10. The load lock chamber 3 is provided with a lid (not shown). The lid closes or opens a gate which connects the internal space of the load lock chamber 3 with the outside.

The load lock chamber 3 is provided with a vacuum pump 4. The vacuum pump 4 is controlled by the bonding unit control unit 10 to exhaust gas from the internal space of the load lock chamber 3. As the vacuum pump 4, a turbo-molecular pump, a cryopump, and an oil diffusion pump are exemplified. Moreover, the load lock chamber 3 is provided with a conveyance mechanism 6 therein. The conveyance mechanism 6 is controlled by the bonding unit control unit 10 to convey a wafer or a substrate arranged in the load lock chamber 3 through the gate valve 5 to the bonding chamber 2, or to convey the wafer arranged in the bonding chamber 2 through the gate valve 5 into the internal space of the load lock chamber 3.

The bonding chamber 2 is provided with a vacuum pump 9. The vacuum pump 9 is controlled by the bonding unit control unit 10 to exhaust gas from the internal space of the bonding chamber 2. As the vacuum pump 9, a turbo-molecular pump, a cryopump, and an oil diffusion pump are exemplified.

Moreover, the bonding chamber 2 is provided with a stage cartridge 45 and a positioning mechanism 12. The stage cartridge 45 is arranged inside the bonding chamber 2 and is supported to be movable in a horizontal direction and rotatable around a rotation axis parallel to a vertical direction. Moreover, the positioning mechanism 12 is controlled by the bonding unit control unit 10, to drive the stage cartridge 45 such that the stage cartridge 45 moves in the horizontal direction and rotates around the rotation axis parallel to the vertical direction.

Moreover, the bonding chamber 2 is provided with a pressure bonding mechanism 11, a pressure bonding axis 13, an electrostatic chuck 18 and a load meter 19. The pressure bonding axis 13 is supported to be movable in parallel to the vertical direction with respect to the bonding chamber 2. The electrostatic chuck 18 is arranged in the bottom end of the pressure bonding axis 13 and is provided with a dielectric layer on the surface opposite to the positioning mechanism 12. The electrostatic chuck 18 is controlled by the bonding unit control unit 10 to hold a wafer by electrostatic force. The pressure bonding mechanism 11 is controlled by the bonding unit control unit 10 to move the pressure bonding axis 13 in parallel to the vertical direction with respect to the bonding chamber 2. Moreover, the pressure bonding mechanism 11 measures a position of the electrostatic chuck 18, and outputs the measured position to the bonding unit control unit 10. The load meter 19 measures the load applied to the wafer held by the electrostatic chuck 18 by measuring the load applied to the pressure bonding axis 13, and outputs the measured load to the bonding unit control unit 10.

Moreover, the bonding chamber 2 is provided with an ion gun 14 and an electron source 15. The ion gun 14 is arranged to turn to a space between the positioning mechanism 12 and the electrostatic chuck 18 when the electrostatic chuck 18 is arranged in an upper position. The ion gun 14 is controlled by the bonding unit control unit 10 to emit and accelerate argon ions along an irradiation axis which passes through the space between the positioning mechanism 12 and the electrostatic chuck 18 and intersects with the inner wall of the bonding chamber 2. Moreover, the ion gun 14 is provided with metal targets (not shown). The metal target is arranged in the position to which the argon ions are irradiated. It should be noted that when it is unnecessary that metal atoms are adhered to the bonding surface of the wafer, the metal target can be omitted. Like the ion gun 14, the electron source 15 is arranged to turn to the space between the positioning mechanism 12 and the electrostatic chuck 18. The electron source 15 is controlled by the bonding unit control unit 10 to emit and accelerate the electrons along another irradiation axis which passes through the space between the positioning mechanism 12 and the electrostatic chuck 18 and intersects the inner wall of the bonding chamber 2.

Figure 2:
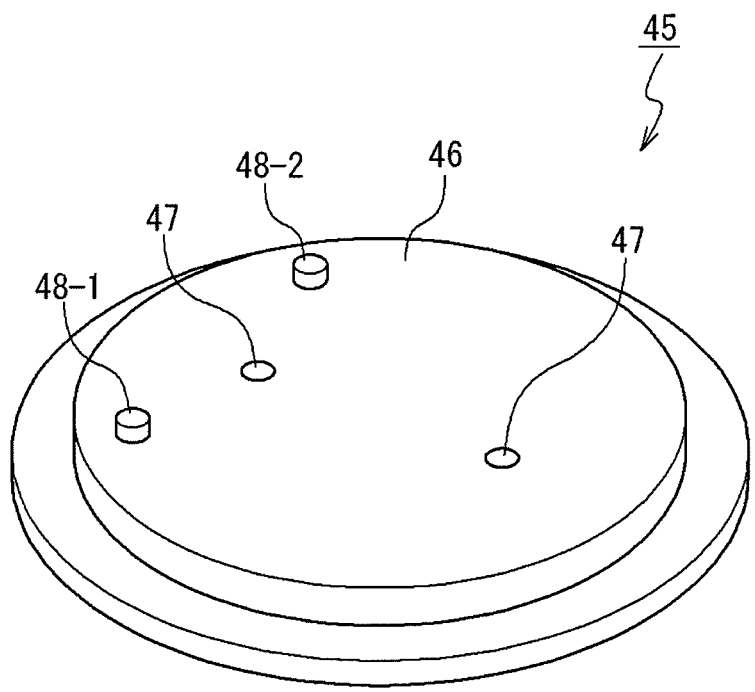
FIG. 2 is a perspective view showing a stage cartridge.

FIG. 2 shows the stage cartridge 45. The stage cartridge 45 is formed to have an almost disk-like shape. The stage cartridge 45 is arranged so that a perpendicular axis of the disk-like shape is parallel to the vertical direction, and a flat support surface 46 is formed on the upper-side surface of the disk-like shape. In the stage cartridge 45, a plurality of alignment holes 47 are formed in the support surface 46. Moreover, in the stage cartridge 45, a plurality of positioning pins 48-1 to 48-2 are formed in a peripheral region of the support surface 46. The plurality of positioning pins 48-1 to 48-2 are circular and are formed as tapered prominences.

Figure 3:
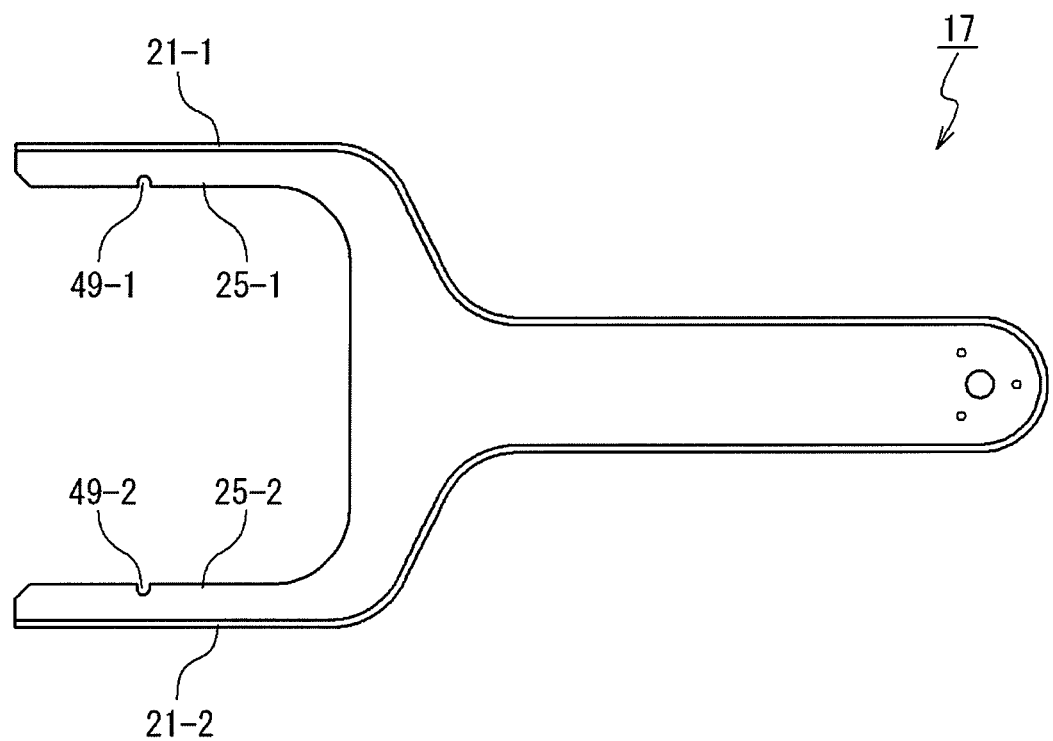
FIG. 3 is a plan view showing a hand of a conveyance mechanism.

FIG. 3 shows a hand 17 provided for the conveyance mechanism 6. The hand 17 has nails 21-1 and 21-2. The nails 21-1 and 21-2 are respectively formed to have a tabular shape. The nails 21-1 and 21-2 are arranged in a horizontal plane. The nail 21-1 has a side edge 25-1 extending in a straight line, and the nail 21-2 has a side edge 25-2 extending in a straight line. The nails 21-1 and 21-2 are arranged such that the side edge 25-1 opposes to the side edge 25-2, and the side edge 25-1 and the side edge 25-2 are parallel. Moreover, in the nail 21-1, a cutout 49-1 is formed at a part of the side edge 25-1. In the nail 21-2, a cutout 49-2 is formed at a part of the side edge 25-2. The cutout 49-1 and the cutout 49-2 are formed to be opposite to each other.

Figure 4:
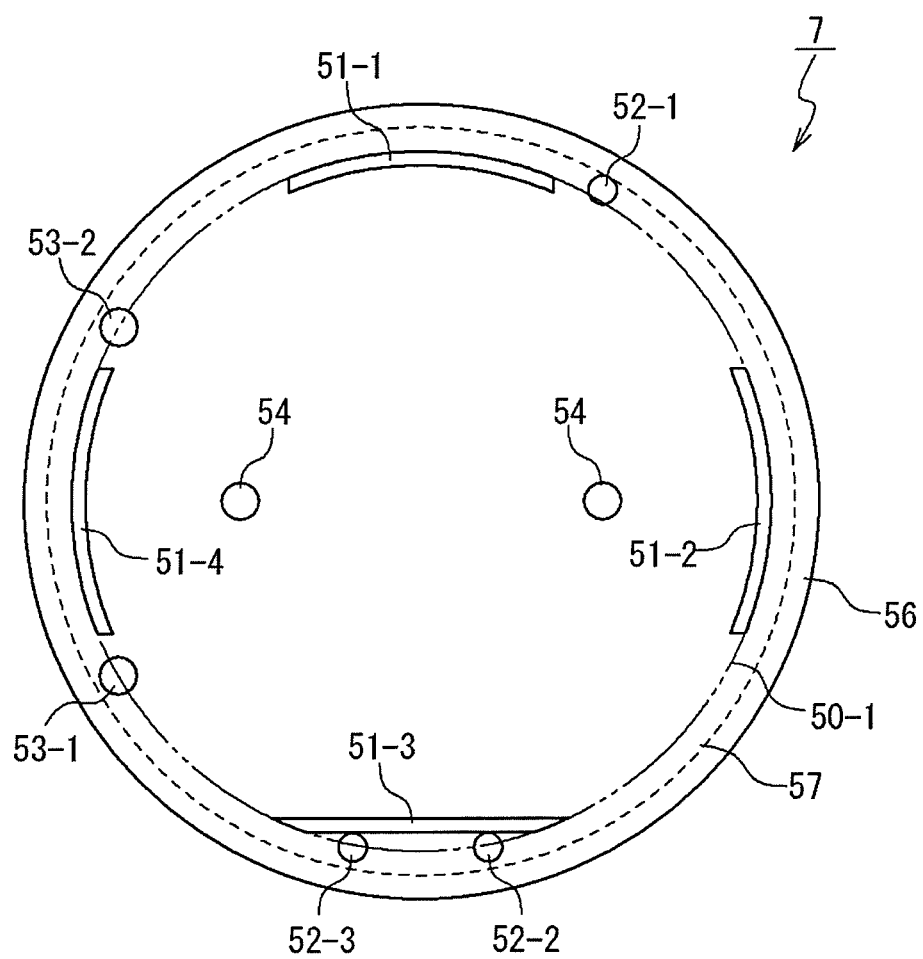
FIG. 4 is a plan view showing an upper-side cartridge.

FIG. 4 shows an upper-side cartridge 7. The upper-side cartridge 7 is formed of aluminum or stainless steel, is formed to have an almost disk-like shape, and is used to put an upper-side wafer. A plurality of positioning holes 53-1 and 53-2 and a plurality of alignment holes 54 are formed in the upper-side cartridge 7. The plurality of positioning holes 53-1 and 53-2 are formed to be circular and are formed in the neighborhood to the outer circumference of the disk-like shape. The diameter of the plurality of positioning holes 53-1 and 53-2 is substantially equal to the diameter of the positioning pins 48-1 to 48-2 of the stage cartridge 45, respectively. Moreover, the plurality of positioning holes 53-1 and 53-2 are formed so that the distance between the positioning hole 53-1 and positioning hole 53-2 is same as the distance between the positioning pin 48-1 and the positioning pin 48-2. That is, the plurality of positioning holes 53-1 and 53-2 are arranged to engage with plurality of positioning pins 48-1 to 48-2 when the upper-side cartridge 7 is put on the stage cartridge 45. That is, when being placed on the stage cartridge 45 so that the plurality of positioning pins 48-1 to 48-2 are engaged with the plurality of positioning holes 53-1 and 53-2, the upper-side cartridge 7 is specified on a predetermined position of the stage cartridge 45.

The plurality of alignment holes 54 are formed to pass through the upper-side cartridge 7. When the upper-side cartridge 7 is put on the stage cartridge 45, the plurality of alignment holes 54 are formed to be connected with the plurality of alignment holes 47 of the stage cartridge 45, respectively. Moreover, when an upper-side wafer is put on the upper-side cartridge 7, the plurality of alignment holes 54 are formed to fit to alignment marks formed on the wafer.

Moreover, the upper-side cartridge 7 is provided with a plurality of island portions 51-1 to 51-4 and a plurality of wafer positioning pins 52-1 to 52-3 on the upper-side surface of a disk-like shape. The plurality of island portions 51-1 to 51-4 are formed as prominences which protrude from the upper-side surface of the disk-like shape, so as their upper ends to be in a same plane, and are formed to match the outer periphery of the wafer to be put on the upper-side cartridge 7. The plurality of wafer positioning pins 52-1 to 52-3 are formed as prominences which protrude from the upper-side surface of the disk-like shape and are formed to match the outer periphery of the wafer to be put on the upper-side cartridge 7. Especially, the wafer positioning pins 52-2 and 52-3 are formed to match the orientation flat of the wafer to be put on the upper-side cartridge 7. At this time, when the upper-side wafer is put on a predetermined position of the upper-side cartridge 7, the orientation flat of the wafer contacts the wafer positioning pins 52-2 and 52-3, and the outer circumference of the wafer contacts the wafer positioning pin 52-1. Moreover, when the upper-side wafer is specified in the predetermined position on the upper-side cartridge 7, the plurality of island portions 51-1 to 51-4 is formed such that passages connect a space between the upper-side cartridge 7 and the upper-side wafer with the outside. That is, the plurality of island portions 51-1 to 51-4 are formed not to be continuous.

Figure 5:
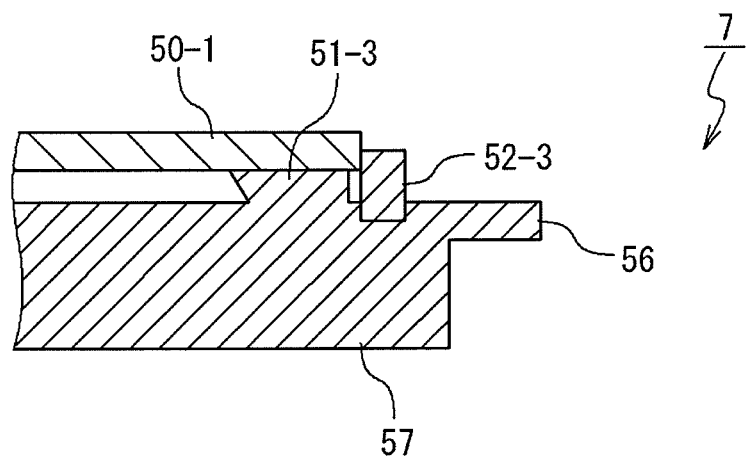
FIG. 5 is a sectional view showing wafer positioning pins.

Moreover, the plurality of wafer positioning pins 52-1 to 52-3 are formed higher than the plurality of island portions 51-1 to 51-4 and are formed lower than a summation of the height of plurality of island portions 51-1 to 51-4 and the thickness of the wafer. That is, as shown in FIG. 5, the plurality of island portions 51-1 to 51-4 are formed to contact the outer periphery section of the lower-side surface of the upper-side wafer on the side of the upper-side cartridge 7 when the upper-side wafer is put on the upper-side cartridge 7. The plurality of wafer positioning pins 52-1 to 52-3 are formed to contact the side surface of the upper-side wafer when the upper-side wafer is put on the upper-side cartridge 7. The plurality of wafer positioning pins 52-1 to 52-3 are formed not to protrude from the upper-side surface of the upper-side wafer on the opposite side to the upper-side cartridge 7 when the upper-side wafer is put on the upper-side cartridge 7.

Figure 6:
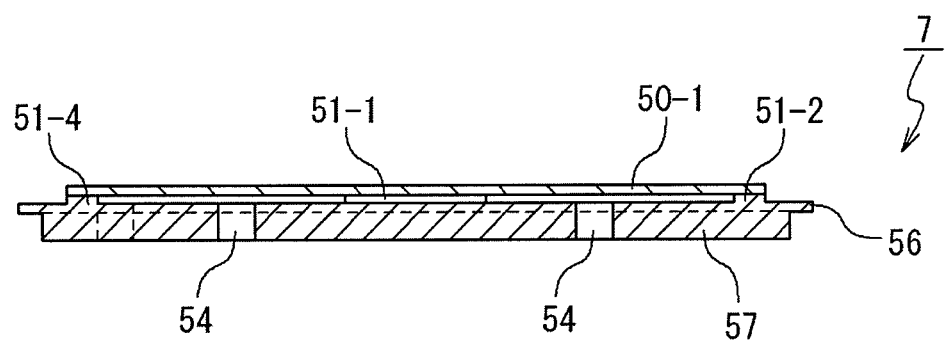
FIG. 6 is a sectional view showing the upper-side cartridge.

As shown in FIG. 6, the upper-side cartridge 7 is formed from a flange section 56 and a body section 57. The body section 57 is formed to have a column-like shape. The diameter of the column-like shape is smaller than the distance between the side edge 25-1 and the side edge 25-2 in the hand 17. The flange section 56 is formed to project from the side of the column-like shape of the body section 57 and is formed to have a disk-like shape. The diameter of the disk-like shape is larger than the distance between the side edge 25-1 and side edge 25-2 in the hand 17. That is, because the flange section 56 is put on the nails 21-1 and 21-2, the upper-side cartridge 7 is held by the conveyance mechanism 6.

Figure 7:
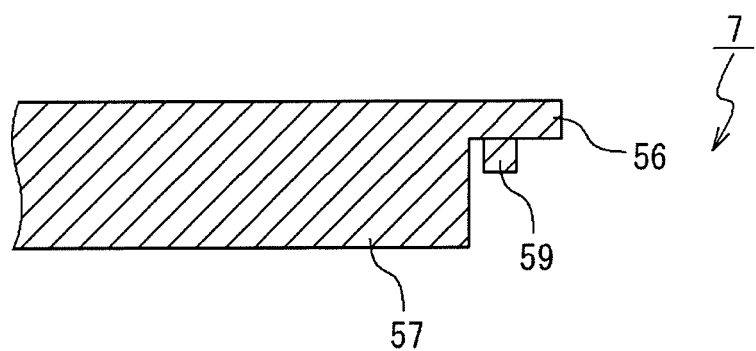
FIG. 7 is a sectional view showing a positioning pin.

As shown in FIG. 7, positioning pins 59 are further provided for the upper-side cartridge 7. The positioning pin 59 is formed as a prominence which protrudes from the lower-side surface of the flange section 56. The diameter of the positioning pin 59 is almost equal to the diameter of each of the cutouts 49-1 to 49-2. The two positioning pins 59 are formed in two symmetrical points with respect to the center of the disk of the flange section 56. That is, the positioning pins 59 are formed to be respectively engaged with the cutouts 49-1 and 49-2 of the nails 21-1 and 21-2 when the upper-side cartridge 7 is held by the conveyance mechanism 6. At this time, when being held by the conveyance mechanism 6 to be respectively fitted with the cutouts 49-1 and 49-2 of the nails 21-1 and 21-2, the upper-side cartridge 7 is held in a predetermined position of the hand 17.

Figure 8:
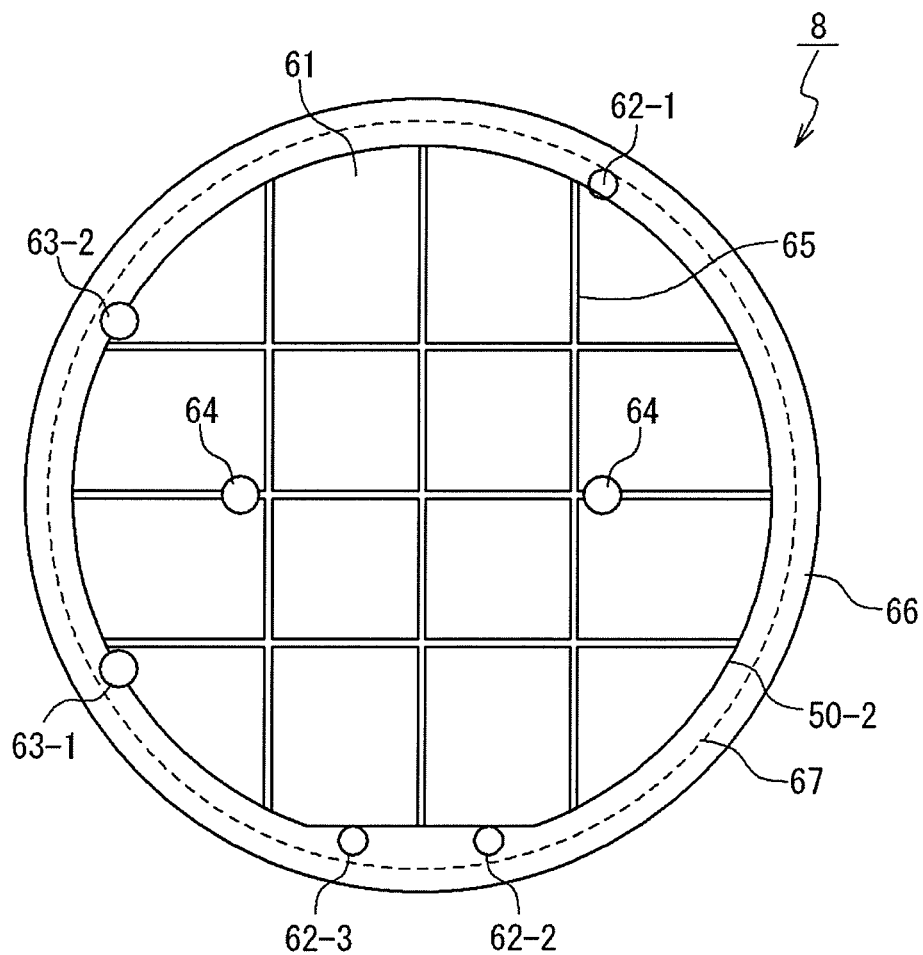
FIG. 8 is a plan view showing the lower-side cartridge.

FIG. 8 shows a lower-side cartridge 8. The lower-side cartridge 8 is formed of aluminum or stainless steel, is formed to have an almost disk-like shape, and is used to put a lower-side wafer. A plurality of positioning holes 63-1 and 63-2 and a plurality of alignment holes 64 are provided for the lower-side cartridge 8. The plurality of positioning holes 63-1 and 63-2 are formed to be circular and are formed in the neighborhood to the outer periphery of the disk-like shape. The diameter of the plurality of positioning holes 63-1 and 63-2 is substantially equal to the diameter of the positioning pins 48-1 and 48-2 of the stage cartridge 45, respectively. Moreover, the plurality of positioning holes 63-1 and 63-2 are formed such that a distance between the positioning hole 63-1 and the positioning hole 63-2 is equal to the distance between the positioning pin 48-1 and the positioning pin 48-2. That is, the plurality of positioning holes 63-1 to 63-2 are arranged to be engaged with the plurality of positioning pins 48-1 to 48-2 when the lower-side cartridge 8 is put on the stage cartridge 45. That is, when the lower-side cartridge 8 is arranged on the stage cartridge 45 such that the plurality of positioning pins 48-1 and 48-2 are engaged with the plurality of positioning holes 63-1 and 63-2, the lower-side cartridge 8 is put on a predetermined position of the stage cartridge 45.

The plurality of alignment holes 64 are formed to pass through the lower-side cartridge 8. The plurality of alignment holes 64 are formed to be connected with the holes 47 of the stage cartridge 45 for the plurality of alignment marks, respectively, when the lower-side cartridge 8 is put on the stage cartridge 45. Moreover, the plurality of alignment holes 64 are formed to match an alignment mark formed on the lower-side wafer when the lower-side wafer is put on the lower-side cartridge 8.

Moreover, the lower-side cartridge 8 is provided with island portions 61 and a plurality of wafer positioning pins 62-1 to 62-3 on the upper-side surface of the disk-like shape. The island sections 61 are formed as prominences which protrude from the upper-side surface of the disk such that the upper ends of the prominences are in a plane, and are formed to have the almost same shape of a wafer to be put on the lower-side cartridge 8. The island portions 61 are separated by grooves 65 in the upper end of the island portions 61. The grooves 65 are formed in a grid manner in the upper end of the island portions 61. Moreover, the grooves 65 are formed to extend the side surface of the island portions 61.

The plurality of wafer positioning pins 62-1-62-3 are formed as prominences which protrude from the upper-side surface of the disk-like shape and are formed to contact the outer periphery of the wafer to be put on the lower-side cartridge 8. The wafer positioning pins 62-2 and 62-3 are formed to contact the orientation flat of the wafer to be put on the lower-side cartridge 8. At this time, when the lower-side wafer is put on the lower-side cartridge 8 such that the orientation flat contacts the wafer positioning pins 62-2 and 62-3 and the side of the outer periphery of the wafer contacts the wafer positioning pin 62-1, the lower-side wafer is put in a predetermined position of the lower-side cartridge 8.

Moreover, the plurality of wafer positioning pins 62-1 to 62-3 are formed higher than the island portions 61 and are formed lower than a summation of the height of island portions 61 and the thickness of the wafer. That is, when the lower-side wafer is put on the lower-side cartridge 8, the island sections 61 are formed to contact most of the lower-side surface of the wafer on the side of the cartridge 8. The plurality of wafer positioning pins 62-1 to 62-3 are formed to contact the side of the lower-side wafer when the lower-side wafer is put on the lower-side cartridge 8. The plurality of wafer positioning pins 62-1 to 62-3 are formed not to protrude from the upper-side surface of the lower-side wafer when the lower-side wafer is put on the lower-side cartridge 8.

Figure 9:
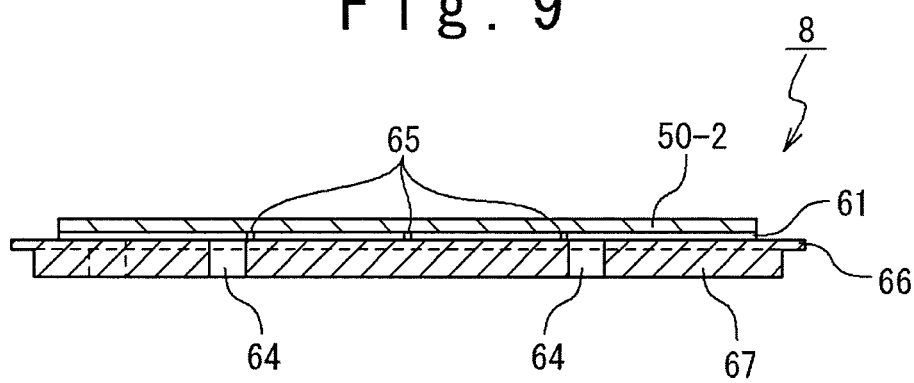
FIG. 9 is a sectional view showing the lower-side cartridge.

As shown in FIG. 9, the lower-side cartridge 8 is formed from a flange section 66 and a body section 67. The body section 67 is formed to have a column-like shape. The diameter of the column is smaller than a distance between the side edge 25-1 and the side edge 25-2. The flange section 66 is formed to project from the side of the column-like shape of the body section 67 and is formed to have a disk-like shape. The diameter of the disk is larger than the distance between the side edge 25-1 and the side edge 25-2. That is, because the flange section 66 is put on the nails 21-1 and 21-2, the lower-side cartridge 8 is held by the conveyance mechanism 6.

Moreover, like the upper-side cartridge 7, the lower-side cartridge 8 is provided with positioning pins. The positioning pins are formed as prominences which protrude from the lower-side surface of the flange section 66. The diameter of the positioning pin is substantially equal to the diameter of the cutouts 49-1 and 49-2. The two positioning pins are formed on two symmetrical positions with respect to the center of the disk of the flange section 66. That is, the positioning pins are formed to engage with the cutouts 49-1 and 49-2 of the nails 21-1 and 21-2, respectively, when the lower-side cartridge 8 is held by the conveyance mechanism 6. At this time, when being held by the conveyance mechanism 6 to be respectively engaged with the cutouts 49-1 and 49-2 of the nails 21-1 and 21-2, the lower-side cartridge 8 is held in a predetermined position of the hand 17.

Figure 10:
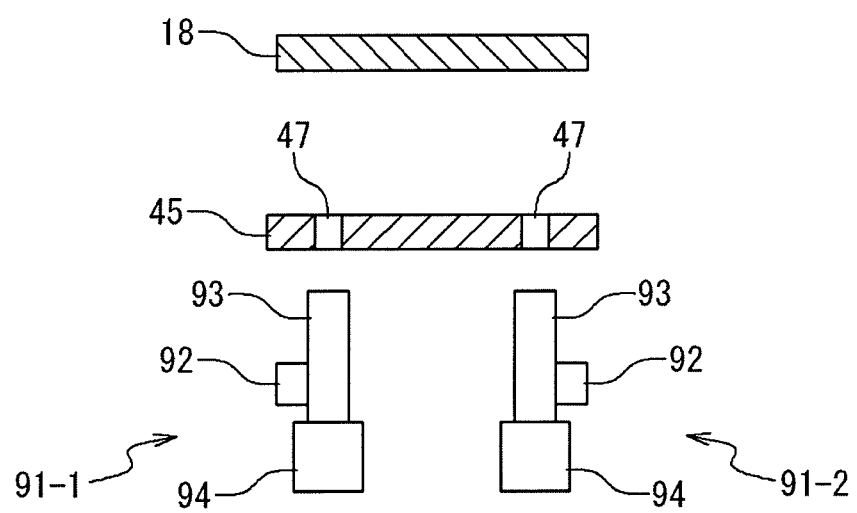
FIG. 10 is a plan view showing an alignment mechanism.

As shown in FIG. 10, the bonding unit 1 is further provided with two alignment mechanisms 91-1 and 91-2. The alignment mechanism 91-1 and 91-2 are arranged outside the bonding chamber 2 and are arranged on the opposite side of the electrostatic chuck 18 with respect to the stage cartridge 45. Each of the alignment mechanisms 91-1 and 91-2 is provided with a light source 92, a tube framework 93 and a camera 94. The light source 92, the tube framework 93 and the camera 94 are fixed on the bonding chamber 2. The light source 92 is controlled by the bonding unit control unit 10 to generate infrared rays which penetrate into a silicon substrate. As the wavelength of the infrared rays, an equal to or more than 1-μm wavelength is exemplified. The tube framework 93 changes the direction of the infrared rays which are generated by the light source 92, into a vertical direction and irradiates the infrared rays for the plurality of alignment holes 47 of the stage cartridge 45. Moreover, the tube framework 93 conducts the infrared rays emitted from the plurality of alignment holes 47 of the stage cartridge 45 for the tube framework 93 into the camera 94. The camera 94 is controlled by the bonding unit control unit 10, to generate an image from the infrared rays which passes through the tube framework 93 and output an electrical signal showing the image to the bonding unit control unit 10.

Figure 11:
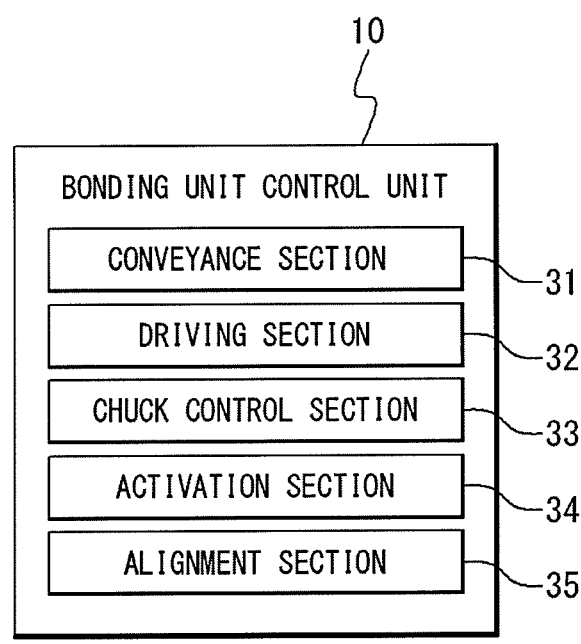
FIG. 11 is a block diagram showing a bonding unit control unit according to the present invention.

FIG. 11 shows the bonding unit control unit 10. The bonding unit control unit 10 is provided with a CPU, a storage, a removable memory drive, an input unit and an interface (which are not shown). The CPU executes a computer program which is installed in the bonding unit control unit 10 and controls the storage, the input unit and the interface. The storage stores a computer program and temporarily stores data which are generated by the CPU. The removable memory drive is used to read the data which has been stored in a storage medium when the storage medium is inserted. Especially, the removable memory drive is used to install the computer program in the bonding unit control unit 10 when the storage medium in which the computer program has been stored is inserted. The input unit is operated by the user to generate data and outputs the data to the CPU. As the input unit, a keyboard is exemplified. The interface outputs data generated by one of external units being connected with the bonding unit control unit 10, to the CPU, and outputs data generated by the CPU to the external unit. The external units contain the vacuum pump 4, the conveyance mechanism 6, the vacuum pump 9, the pressure bonding mechanism 11, the positioning mechanism 12, the ion gun 14, the electron source 15, the electrostatic chuck 18, the load meter 19, the light source 92 and the camera 94.

The computer program which is installed in the bonding unit control unit 10 is formed from a plurality of computer program portions to make the bonding unit control unit 10 realize a plurality of functions. The plurality of functions contain a conveyance section 31, a driving section 32, a chuck control section 33, an activation section 34 and an alignment section 35.

The conveyance section 31 closes the gate valve 5. Moreover, when the gate valve 5 is closed, the conveyance section 31 sets the load lock chamber 3 to a preliminary atmosphere with a predetermined vacuum degree inside by using the vacuum pump 4 or sets the load lock chamber 3 to an atmosphere with an atmospheric pressure. When the load lock chamber 3 is set to the atmosphere with the preliminary vacuum degree, the conveyance section 31 opens or closes the gate valve 5. When the gate valve 5 is open, the conveyance section 31 conveys the stage cartridge 45 which is arranged inside the load lock chamber 3 to the positioning mechanism 12 by using the conveyance mechanism 6 or conveys the stage cartridge 45 which is held by the positioning mechanism 12, into the load lock chamber 3 by using the conveyance mechanism 6.

The driving section 32 controls the pressure bonding mechanism 11 so as to move the electrostatic chuck 18 in parallel. Moreover, the driving section 32 calculates a timing at which the electrostatic chuck 18 reaches a predetermined position, and controls the pressure bonding mechanism 11 to stop the electrostatic chuck 18 at the timing. The driving section 32 calculates the timing that the load measured by the load meter 19 reaches a predetermined load, and controls the pressure bonding mechanism 11 to stop the electrostatic chuck 18 at the timing.

The chuck control section 33 controls the electrostatic chuck 18 to hold a wafer or not to hold the wafer.

When the gate valve 5 is closed, the activation section 34 sets the bonding chamber 2 to a bonding atmosphere with a predetermined vacuum degree by using the vacuum pump 9. Moreover, when the bonding chamber 2 is set to the bonding atmosphere, the activation section 34 controls the ion gun 14 to emit argon ions for a space between the upper-side wafer and the lower-side wafer. Moreover, while the argon ions are emitted, the activation section 34 controls the electron source 15 to emit electrons for the space between the upper-side wafer and the lower-side wafer.

When the upper-side cartridge 7 having the upper-side wafer thereon is on the stage cartridge 45, the alignment section 35 controls the positioning mechanism 12 such that the upper-side wafer is positioned in a predetermined horizontal position. Moreover, when the electrostatic chuck 18 holds an upper-side wafer and the lower-side cartridge 8 having the lower-side wafer thereon is located on the stage cartridge 45, the alignment section 35 controls the pressure bonding mechanism 11 to bring the upper-side wafer close to the lower-side wafer up to a predetermined distance. Moreover, the alignment section 35 controls the positioning mechanism 12 to set the lower-side wafer to a horizontal position for the upper-side wafer when the upper-side wafer and the lower-side wafer are brought close to each other up to the predetermined distance.

The bonding method according to the embodiment of present invention includes an operation performed by using the bonding unit 1 and an operation performed without using the bonding unit 1.

Figure 12:
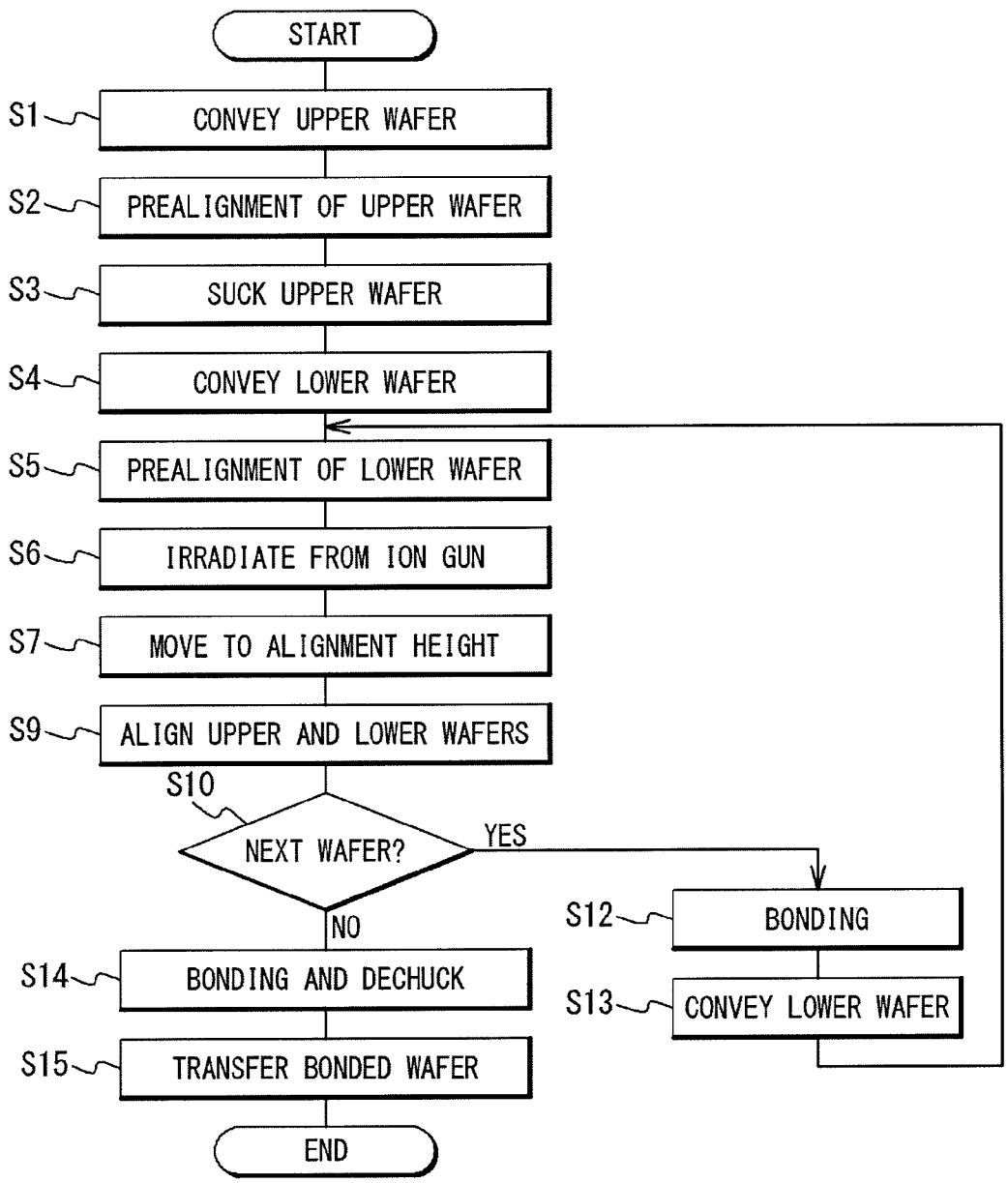
FIG. 12 is a flow chart showing an operation executed by using a bonding unit.

FIG. 12 shows the operation performed by using the bonding unit 1. An operator first closes the gate valve 5, and then sets the bonding chamber 2 to a vacuum atmosphere by using the vacuum pump 9 and the load lock chamber 3 to an atmosphere with the atmospheric pressure. The operator puts an upper-side wafer on the upper-side cartridge 7 such that the orientation flat of the upper-side wafer contacts the wafer positioning pins 52-2 and 52-3 and the side of the outer periphery of the upper-side wafer contacts the wafer positioning pin 52-1. Moreover, the operator puts the lower-side wafer on the lower-side cartridge 8 such that the orientation flat of the lower-side wafer contact the wafer positioning pins 62-2 and 62-3, and the side of the outer periphery of the lower-side wafer contacts the wafer positioning pin 62-1. A plurality of the lower-side cartridges 8 with the lower-side wafers are prepared. The operator opens the lid of the load lock chamber 3, and arranges the upper-side cartridge 7 in the load lock chamber 3 and arranges the plurality of lower-side cartridges 8 in the load lock chamber 3. Next, the operator closes the lid of the load lock chamber 3 and sets the load lock chamber 3 to the vacuum atmosphere.

The bonding unit control unit 10 opens the gate valve 5 after the load lock chamber 3 is set to the vacuum atmosphere. The bonding unit control unit 10 first controls the electrostatic chuck 18 to hold the upper-side wafer. The bonding unit control unit 10 controls the conveyance mechanism 6 to convey the upper-side cartridge 7 with the upper-side wafer put, from the load lock chamber 3 to the stage cartridge 45. The bonding unit control unit 10 controls the conveyance mechanism 6 to move down the hand 17 of the conveyance mechanism 6. At this time, the upper-side cartridge 7 is held by the stage cartridge 45 by engaging the plurality of positioning holes 53-1 and 53-2 with the plurality of positioning pins 48-1 to 48-2 of the stage cartridge 45, respectively (Step S1). The bonding unit control unit 10 controls the conveyance mechanism 6 to draw back the hand 17 of the conveyance mechanism 6 into the load lock chamber 3.

Next, the bonding unit control unit 10 controls the alignment mechanisms 91-1 and 91-2 to pickup images of the alignment marks formed on the upper-side wafer. The bonding unit control unit 10 controls the positioning mechanism 12 based on the images such that the upper-side wafer is positioned in the predetermined horizontal position (Step S2). Next, the bonding unit control unit 10 controls the pressure bonding mechanism 11 to move the electrostatic chuck 18 down into the vertical direction. The bonding unit control unit 10 controls the pressure bonding mechanism 11 to stop the electrostatic chuck 18 when the electrostatic chuck 18 contacts the upper-side wafer, and controls the electrostatic chuck 18 to hold an upper-side wafer. At this time, because the plurality of wafer positioning pins 52-1 to 52-3 of the upper-side cartridge 7 are formed not to protrude from the upper-side wafer, the wafer positioning pins 52-1 to 52-3 of the upper-side cartridge 7 do not contact the electrostatic chuck 18. Therefore, the bonding unit 1 can make the electrostatic chuck 18 contact the upper-side wafer more surely and can make the electrostatic chuck 18 hold the upper-side wafer more surely. The bonding unit control unit 10 controls the pressure bonding mechanism 11 such that the upper-side wafer leaves the upper-side cartridge 7, that is, the electrostatic chuck 18 rise upwardly. The bonding unit control unit 10 controls the conveyance mechanism 6 to draw back the upper-side cartridge 7 with no upper-side wafer from the stage cartridge 45 into the load lock chamber 3 after the upper-side wafer leaves the upper-side cartridge 7 (Step S3).

The bonding unit control unit 10 controls the conveyance mechanism 6 to convey the cartridge 8 with the lower-side wafer put from the load lock chamber 3 to the stage cartridge 45 after the electrostatic chuck 18 holds the upper-side wafer. The bonding unit control unit 10 controls the conveyance mechanism 6 to move down the hand 17 of the conveyance mechanism 6. At this time, the lower-side cartridge 8 is held by the stage cartridge 45 such that the plurality of positioning holes 63-1 and 63-2 are engaged with the plurality of positioning pins 48-1 and 48-2 of the stage cartridge 45, respectively. The bonding unit control unit 10 controls the conveyance mechanism 6 to draw back the hand 17 of the conveyance mechanism 6 into the load lock chamber 3. Next, the bonding unit control unit 10 closes the gate valve 5 and controls the vacuum pump 9 to vacuum the bonding chamber 2 to the bonding atmosphere with a predetermined vacuum degree (Step S4).

Next, the bonding unit control unit 10 controls alignment mechanisms 91-1 and 91-2 to pick up images of the alignment marks formed on the lower-side wafer. The bonding unit control unit 10 controls the positioning mechanism 12 based on the images to position the lower-side wafer to a predetermined horizontal position (Step S5). When the bonding chamber 2 is set to the bonding atmosphere, the bonding unit control unit 10 controls the ion gun 14 to emit particles for a space between the upper-side wafer and the lower-side wafer in a state which the upper-side wafer held by the electrostatic chuck 18 is apart from the lower-side wafer held by the stage cartridge 45 (Step S6). The particles are irradiated to the upper-side wafer and the lower-side wafer to remove oxide films formed on the surfaces and removes impurities adhered to the surfaces.

The bonding unit control unit 10 controls the pressure bonding mechanism 11 to move down the electrostatic chuck 18 to a predetermined position downwardly into the vertical direction. The bonding unit control unit 10 controls the pressure bonding mechanism 11 such that the upper-side wafer and the lower-side wafer leave from each other by a predetermined distance, that is, the electrostatic chuck 18 stops at a predetermined position (Step S7). Next, the bonding unit control unit 10 controls the alignment mechanisms 91-1 and 91-2 such that the images of the alignment marks formed on the upper-side wafer and the alignment marks formed on the lower-side wafer are picked up. The bonding unit control unit 10 controls the positioning mechanism 12 based on the images of the upper-side wafer and the lower-side wafer, so as to be bonded according to design (Step S9).

After the upper-side wafer and the lower-side wafer are bonded, when the bonded upper-side wafer should be bonded with another lower-side wafer (Step S10, YES), the bonding unit control unit 10 controls the pressure bonding mechanism 11 such that the bonded upper-side wafer contact the other lower-side wafer, that is, the electrostatic chuck 18 moves down downwardly into the vertical direction (Step S12). The upper-side wafer and the lower-side wafer are bonded through the contact of them and one sheet of bonded wafer is generated. At this time, because the plurality of wafer positioning pins 62-1 to 62-3 of the lower-side cartridge 8 are formed not to protrude from the lower-side wafer, the pins 62-1 to 62-3 do not contact the electrostatic chuck 18 or the upper-side wafer. Therefore, the bonding unit 1 can make the upper-side wafer contact the lower-side wafer more surely and can bond the upper-side wafer and the lower-side wafer more surely. Moreover, at this time, the island portions 61 of the lower-side cartridge 8 contact most of all the part of the lower-side wafer. Therefore, the lower-side wafer can be prevented from damage due to the load which is applied in the bonding. Also, the bonding unit 1 can apply a larger load on the upper-side wafer and the lower-side wafer.

The bonding unit control unit 10 controls the electrostatic chuck 18 to leave the bonding wafer from the lower-side cartridge 8, that is, to continue to hold the bonded wafer, and controls the pressure bonding mechanism 11 such that the electrostatic chuck 18 rises upwardly to the vertical direction. Next, the bonding unit control unit 10 opens the gate valve 5, and controls the conveyance mechanism 6 to draw back the lower-side cartridge 8 from the stage cartridge 45 into the load lock chamber 3. After the lower-side cartridge 8 with no bonded wafer is drawn back into the load lock chamber 3, the bonding unit control unit 10 controls the conveyance mechanism 6 to convey the lower-side cartridge 8 with a lower-side wafer from the load lock chamber 3 to the stage cartridge 45. The bonding unit control unit 10 controls the conveyance mechanism 6 to move down the hand 17 of the conveyance mechanism 6. At this time, the plurality of positioning holes 63-1 and 63-2 are engaged with the plurality of positioning pins 48-1 to 48-2 of the stage cartridge 45, respectively, so that the lower-side cartridge 8 is held by the stage cartridge 45. The bonding unit control unit 10 controls the conveyance mechanism 6 to draw back the hand 17 of the conveyance mechanism 6 into the load lock chamber 3. Next, the bonding unit control unit 10 closes the gate valve 5 and controls the vacuum pump 9 to vacuum the bonding chamber 2 to the bonding atmosphere with a predetermined vacuum degree (Step S13).

Next, the bonding unit control unit 10 controls the alignment mechanisms 91-1 and 91-2 to pick up images of the alignment marks formed on the lower-side wafer. The bonding unit control unit 10 controls the positioning mechanism 12 based on the images to position the lower-side wafer in a predetermined horizontal position of (Step S5). When the bonding atmosphere is generated inside the bonding chamber 2, the bonding unit control unit 10 controls the ion gun 14 to emit particles to a space between the bonded wafer and the lower-side wafer in a state that the bonded wafer held by the electrostatic chuck 18 is separated from the wafer held by the stage cartridge 45 (Step S6). The particles are irradiated to the bonded wafer and the lower-side wafer to remove oxide films formed on the surfaces and remove impurities adhered to the surfaces.

The bonding unit control unit 10 controls the pressure bonding mechanism 11 to move down the electrostatic chuck 18 to a predetermined position downwardly into the vertical direction. The bonding unit control unit 10 controls the pressure bonding mechanism 11 such that the bonded wafer is separated from the lower-side wafer by a predetermined distance, that is, the electrostatic chuck 18 stops at a predetermined position (Step S7). Next, the bonding unit control unit 10 controls the alignment mechanisms 91-1 and 91-2 such that the images of the alignment marks formed on the bonded wafer and the alignment marks formed on the lower-side wafer are picked up. The bonding unit control unit 10 controls the positioning mechanism 12 based on the images of the bonded wafer and the lower-side wafer so as to be bonded according to the design (Step S9).

When another lower-side wafer is not bonded after the bonded wafer and the lower-side wafer are bonded (Step S10, NO), the bonding unit control unit 10 controls the pressure bonding mechanism 11 such that the bonded wafer contacts the lower-side wafer, that is, the electrostatic chuck 18 moves down downwardly in the vertical direction. The bonded wafer and the lower-side wafer are bonded through the contact and one sheet of the bonded wafer is generated. Moreover, the bonding unit control unit 10 controls the electrostatic chuck 18 to dechuck the bonded wafer from the electrostatic chuck 18 (Step S14).

According to such an operation, the bonded wafer produced at step S12 can be more bonded with another wafer without being taken out from the bonding chamber 2. Therefore, according to such an operation, three or more wafers can be bonded at higher speed as compared with a case that a couple of wafers are bonded, and three or more wafers can be bonded at a low cost.

The bonding unit control unit 10 controls the pressure bonding mechanism 11 to raise the electrostatic chuck 18 upwardly in the vertical direction. Next, the bonding unit control unit 10 opens the gate valve 5, and controls the conveyance mechanism 6 to convey the cartridge 8 with the bonded wafer put from the stage cartridge 45 to the load lock chamber 3. The bonding unit control unit 10 closes the gate valve 5 and controls the vacuum pump 4 to set the load lock chamber 3 to atmosphere with an atmospheric pressure. The operator opens the lid of the load lock chamber 3 after the atmospheric-pressure atmosphere is set inside the load lock chamber 3, and takes out the bonded wafer (Step S15).

For example, when three wafers (wafers 82, 84, and 86) are bonded to one bonded wafer, the operator prepares three cartridges (cartridges 81, 83, and 85). The operator puts the wafer 82 on the cartridge 81, puts the wafer 84 on the cartridge 83 and puts the wafer 86 on the cartridge 85. As the cartridge 81, the upper-side cartridge 7 is exemplified. As the cartridge 83, the lower-side cartridge 8 is exemplified. As the cartridge 85, the lower-side cartridge 8 is exemplified.

Figure 13:
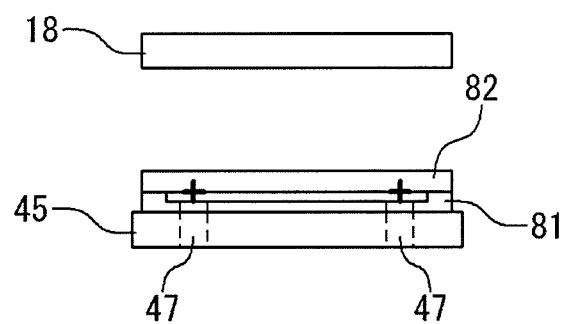
FIG. 13 is a side view showing an example of a state of a bonding object at step S1.

As shown in FIG. 13, after step S1 is executed, the cartridge 81 with the wafer 82 put is set on the stage cartridge 45 and the electrostatic chuck 18 absorbing nothing is arranged in a position apart from the stage cartridge 45.

Figure 14:
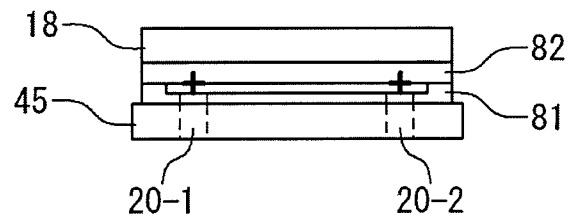
FIG. 14 is a side view showing an example of the state of the bonding object at step S3.

At step S3, as shown in FIG. 14, the wafer 82 put on the cartridge 81 which has been put on the stage cartridge 45 contacts the electrostatic chuck 18 and the wafer 82 is sucked by the electrostatic chuck 18.

Figure 15:
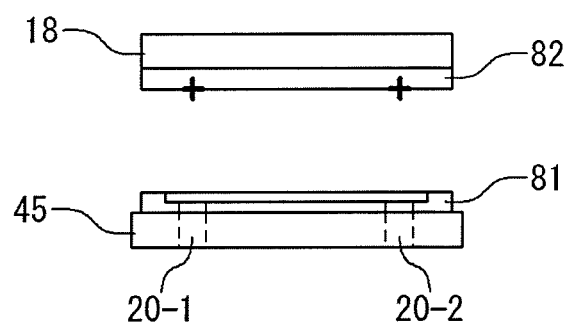
FIG. 15 is a side view showing an example of another state of the bonding object at step S3.

As shown in FIG. 15, after step S3 is executed, the cartridge 81 with no wafer is put on the stage cartridge 45 and the electrostatic chuck 18 on which the wafer 82 has been sucked is arranged in a position the stage cartridge 45.

Figure 16:
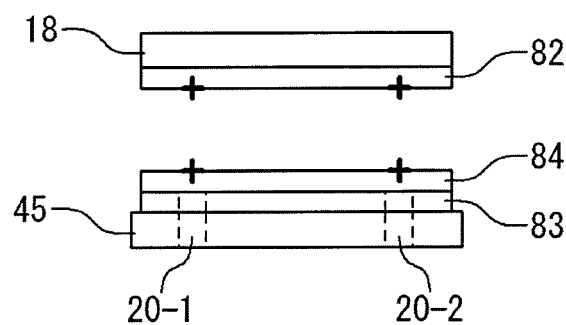
FIG. 16 is a side view showing an example of the state of the bonding object at step S4.

As shown in FIG. 16, after step S4 is executed, the cartridge 83 on which the wafer 84 is put is put on the stage cartridge 45, and the electrostatic chuck 18 by which the wafer 82 has been absorbed is arranged in a position apart from the stage cartridge 45.

Figure 17:
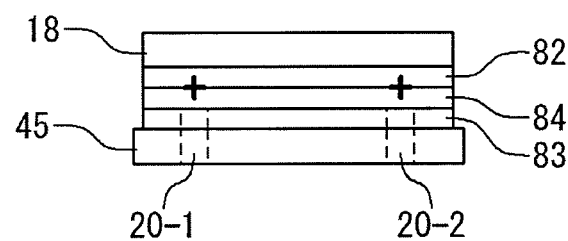
FIG. 17 is a side view showing an example of the state of the bonding object at step S12.

As shown in FIG. 17, at step S12, the wafer 84 put on the cartridge 83 contacts the wafer 82 sucked by the electrostatic chuck 18.

Figure 18:
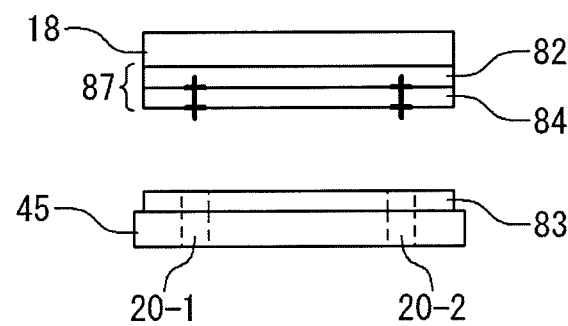
FIG. 18 is a side view showing an example of the state of the bonding object at step S13.

As shown in FIG. 18, after step S12 is executed, the bonded wafer 87 is formed from the wafer 84 and the wafer 82, and the cartridge 83 with no wafer is put on the stage cartridge 45 nothing. The electrostatic chuck 18 by which a bonded wafer 87 has been sucked is arranged in a position apart from the stage cartridge 45.

Figure 19:
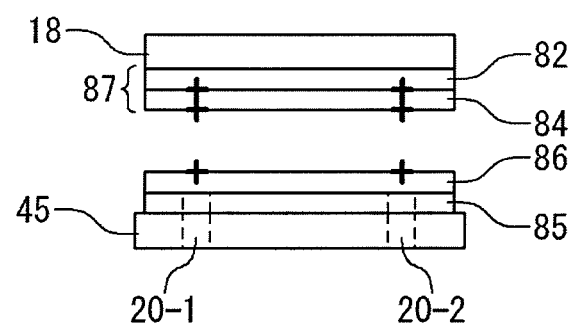
FIG. 19 is a side view showing an example of another state of the bonding object at step S13.

As shown in FIG. 19, after step S13 is executed, the cartridge 85 on which the wafer 86 has been put is put on the stage cartridge 45 and the electrostatic chuck 18 by which the bonded the wafer 87 has been sucked is arranged in a position apart from the stage cartridge 45.

Figure 20:
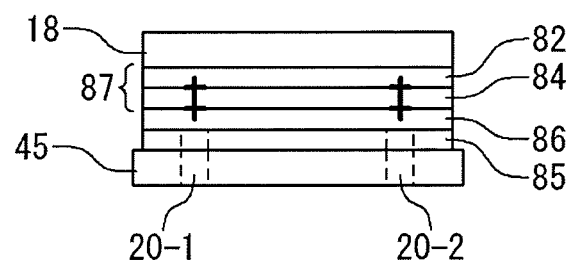
FIG. 20 is a side view showing example of the state of the bonding object at step S14.

Because there is not another wafer to be bonded after the wafer 86, step S14 is executed without executing the step S12. As shown in FIG. 20, at the step S14, the wafer 86 put on the cartridge 85 contacts the bonded wafer 87 sucked by the electrostatic chuck 18.

Figure 21:
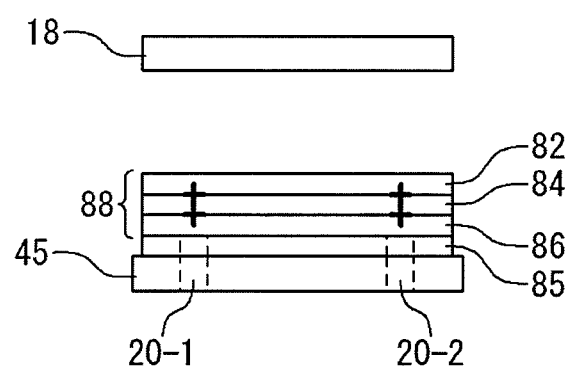
FIG. 21 is a side view showing an example of another state of the bonding object at step S14.

As shown in FIG. 21, after step S14 is executed, a bonded wafer 88 is formed from the bonded wafer 87 and the wafer 86. The cartridge 85 on which the bonded wafer 88 is put is located on the stage cartridge 45. The electrostatic chuck 18 with no wafer is arranged in a position apart from the stage cartridge 45.

According to such an operation, the bonded wafer 87 formed from the wafer 82 and the wafer 84 can be bonded with the wafer 86 without being taken out from the bonding chamber 2. Therefore, according to such an operation, three or more wafers can be bonded at higher speed compared with the case that a couple of the wafers are bonded, and three or more wafers can be bonded at the low cost.

The operation which is executed without using the bonding unit 1 includes an operation of producing a wafer which is a bonding object and an operation of dicing the bonded wafer.

In the operation of producing the wafer as the bonding object, the upper-side wafer and the lower-side wafer are produced, e.g. the wafers 82, 84 and 86 shown in FIG. 13 to FIG. 21 are produced.

It should be noted that the bonded wafer produced by bonding two wafers by using the bonding unit 1 can be applied as the wafer 84 or the wafer 86. Moreover, the wafer obtained by processing the bonded wafer can be applied as the wafer 84 or the wafer 86. If such a wafer is applied as the wafer 84 or the wafer 86, The plurality of wafers can be bonded such that an order where a plurality of bonding surfaces are arranged and an order that the plurality of bonding surfaces are bonded are different from each other. Thus, it is possible to diversify in the form of the bonding.

In the operation of dicing the bonded wafer, the bonded wafer formed by using the bonding unit 1 is divided into a plurality of devices. That is, the operation which is executed by using the bonding unit 1 is suitable for producing the bonded wafer which is divided into the plurality of devices.

Figure 22:
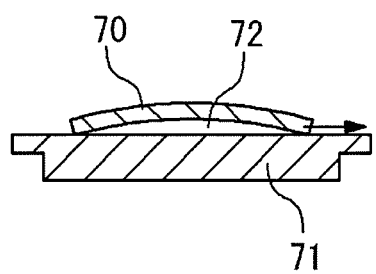
FIG. 22 is a sectional view showing the state that the wafer is put on a cartridge of the comparison example.

A wafer 70 which is exemplified by the upper-side wafer and the lower-side wafer is sometimes transformed as shown in FIG. 22. When the wafer 70 is put on a cartridge 71 which is exemplified by the upper-side cartridge 7 and the lower-side cartridge 8, a space 72 is formed between the wafer 70 and the cartridge 71. The air filling the space 72 lifts the wafer 70 and sometimes moves the wafer 70 along the surface of the cartridge 71 if the atmosphere where the wafer 70 and the cartridge 71 are arranged is decompressed, when there is no passage which connects the space 72 and the outside.

The gas filling the space between the upper-side cartridge 7 and the upper-side wafer is exhausted outside through passages between the plurality of island portions 51-1 to 51-4. Such exhaustion prevents the gas between the upper-side cartridge 7 and the upper-side wafer from lifting the upper-side wafer and prevents the upper-side wafer from moving on the upper-side cartridge 7. Moreover, the gas filling the space between the lower-side cartridge 8 and the lower-side wafer is exhausted outside through the grooves 65 as passages. Such exhaustion prevents the between the lower-side cartridge 8 and the lower-side wafer from lifting the lower-side wafer and prevents the lower-side wafer from moving on the lower-side cartridge 8.

It should be noted that a multi-layer bonding method of bonding according to the present invention may be executed by using another bonding unit in which the alignment mechanisms 91-1 and 91-2 are arranged in other positions. The positions which are nearer to the electrostatic chuck 18 than the positioning mechanism 12, for example, the upper positions of the electrostatic chuck 18 are exemplified. The multi-layer bonding method of according to the present invention can bond three or more wafers at higher speed even when being applied to such a bonding unit, like the above embodiments.

It should be noted that in the other embodiment of the multi-layer bonding method according to the present invention, steps S2, S5, S7 and S9 in the embodiments are omitted. Such a multi-layer bonding method can be applied when high accuracy alignment is unnecessary. Like the embodiments, three or more wafers can be bonded at higher speed and at a low cost.

It should be noted that in the multi-layer bonding method according to another embodiment of the present invention, the conveyance mechanism 6 in the above embodiments directly contacts and conveys the wafer and the stage cartridge 45 directly contacts the wafer and holds the wafer. In such a multi-layer bonding method, three or more wafers can be bonded at higher speed, like the above embodiments. Moreover, in such a multi-layer bonding method, the recovery of the cartridge is unnecessary. Three or more wafers can be bonded at higher speed, as compared with the above embodiments. Moreover, in such a multi-layer bonding method, the cartridge is unnecessary and three or more wafers can be bonded at the low cost.

It should be noted that in the multi-layer bonding method according to another embodiment of the present invention, a plurality of wafers are stacked downwardly in a vertical direction. According to such a multi-layer bonding method, the wafer conveyed into the bonding chamber 2 by the conveyance mechanism 6 is transferred to the electrostatic chuck 2 in the air without being supported by the stage cartridge 45 and is held by the electrostatic chuck 2. Next, the wafer held by the electrostatic chuck 2 is bonded by another wafer supported on the stage cartridge 45. When the bonded wafer is supported on the stage cartridge 45, still another wafer is held by the electrostatic chuck 2 in the same way and the bonded wafer and the wafer held by the electrostatic chuck 2 are bonded. In such a multi-layer bonding method, three or more wafers can be bonded at a low cost, like the multi-layer bonding method in the above embodiment. However, it is difficult transfer a wafer from the conveyance mechanism 6 to the electrostatic chuck 2 in the air, and the control by being handed over is very difficult and becomes labile operation. Therefore, in the multi-layer bonding method in the above embodiment, a plurality of wafers are stacked on the upper side. Three or more wafers can be bonded more stably, compared with a multi-layer bonding method in which a plurality of wafers are laminated on the lower side.

It should be noted that the multi-layer bonding method according to the present invention can be applied to another bonding unit in which two wafers are brought into contact and bonded by moving the wafers into a direction which is different from the vertical direction. As the direction, a horizontal direction is exemplified. In the multi-layer bonding method according to the present invention, three or more wafers can be bonded at a higher speed when being applied to such a bonding unit, like the above embodiments.

This patent application claims a priority based on Japanese Patent Application NO. 2009-247855 filed on Oct. 28, 2009, and the disclosure thereof is incorporated herein by reference.

The invention claimed is:

1. A multi-layer bonding method comprising:
    forming a first bonded substrate by bonding a first substrate and an intermediate substrate in a bonding chamber by using a pressure bonding mechanism;
    holding said first bonded substrate by said pressure bonding mechanism in said bonding chamber;
    conveying a second substrate into said bonding chamber; and
    forming a second bonded substrate by bonding said first bonded substrate and said second substrate in said bonding chamber by said pressure bonding mechanism,
    wherein said intermediate substrate is conveyed into said bonding chamber in a state that said intermediate substrate is put on an intermediate cartridge,
    wherein said first substrate and said intermediate substrate are bonded in the state that said intermediate substrate is put on said intermediate cartridge,
    wherein said intermediate cartridge is conveyed out from said bonding chamber in the state that said first bonded substrate is not put on said intermediate cartridge, after said first substrate and said intermediate substrate are bonded,
    wherein said second substrate is conveyed into said bonding chamber in a state that said second substrate is put on a cartridge, after said intermediate cartridge is conveyed out from said bonding chamber, and
    wherein said first bonded substrate and said second substrate are bonded in the state that said second substrate is put on said cartridge.

2. The multi-layer bonding method according to claim 1, wherein a load applied between said second substrate and said first bonded substrate when said second substrate and said first bonded substrate are bonded is larger than a load applied between said first substrate and said intermediate substrate when said first substrate and said intermediate substrate are bonded.

3. The multi-layer bonding method according to claim 2, further comprising:
    activating opposing surfaces of said intermediate substrate and said first substrate before said first substrate and said intermediate substrate are bonded; and
    activating opposing surfaces of said second substrate and said first bonded substrate before said first bonded substrate and said second substrate are bonded.

4. The multi-layer bonding method according to claim 3, further comprising:
    aligning said first substrate and said intermediate substrate before said first substrate and said intermediate substrate are bonded; and
    aligning said first bonded substrate and said second substrate before said first bonded substrate and said second substrate are bonded.

5. The multi-layer bonding method according to claim 4, further comprising:
    producing said intermediate substrate by processing a third bonded substrate produced by bonding two substrates.

6. The multi-layer bonding method according to claim 5, further comprising:
    producing a plurality of devices by dicing said second bonded substrate.

7. The multi-layer bonding method according to claim 1, further comprising:
    decompressing an internal space of a load lock chamber, when said cartridge is arranged in said load lock chamber and said second substrate is put on said cartridge,
    wherein said second substrate is conveyed from said load lock chamber into said bonding chamber, after the internal space of said load lock chamber is decompressed,
    wherein said cartridge is provided with island portions contacting said second substrate when said second substrate is put on said cartridge, and
    wherein passages are provided for said island portions to connect a space between said cartridge and said second substrate to an outside, when said second substrate is put on said cartridge.

* * * * *